United States Patent
Belady

(10) Patent No.: US 7,327,570 B2
(45) Date of Patent: Feb. 5, 2008

(54) FLUID COOLED INTEGRATED CIRCUIT MODULE

(75) Inventor: Christian L. Belady, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 343 days.

(21) Appl. No.: 11/022,728

(22) Filed: Dec. 22, 2004

(65) Prior Publication Data

US 2006/0133039 A1    Jun. 22, 2006

(51) Int. Cl.
*H05K 7/20* (2006.01)
(52) U.S. Cl. ............ 361/699; 165/80.4; 165/185; 361/687; 62/259.2
(58) Field of Classification Search ........... 165/80.4; 361/699
See application file for complete search history.

(56) References Cited

U.S. PATENT DOCUMENTS

| 5,316,077 | A * | 5/1994 | Reichard ............ 165/104.28 |
| 6,019,165 | A * | 2/2000 | Batchelder ............ 165/80.3 |
| 6,263,957 | B1 * | 7/2001 | Chen et al. ............ 165/80.4 |
| 6,377,458 | B1 * | 4/2002 | Morris et al. ............ 361/699 |
| 6,507,492 | B2 | 1/2003 | Morris et al. |
| 6,606,251 | B1 | 8/2003 | Kenny, Jr. et al. |
| 6,678,168 | B2 | 1/2004 | Kenny, Jr. et al. |
| 6,785,134 | B2 * | 8/2004 | Maveety et al. ............ 361/699 |
| 2004/0182551 | A1 | 9/2004 | Zhou et al. |
| 2004/0188065 | A1 | 9/2004 | Shook et al. |

OTHER PUBLICATIONS

"The Cooligy Electrokinetic Pump; a Silent, Reliable Cooling Solution," Cooligy, Inc., http://cooligy.com/electrokinetic_pump.html, 2004, p. 1-2.
"Advanced Microchannel Cooling Loop; an Efficient Alternative to Heat Sinks," Cooligy, Inc., http://cooligy.com/micro_channel_cooling.html, 2004, p. 1-2.
"Microchannel Cooling; Why Smaller Means Cooler," Cooligy, Inc., http://cooligy.com/microchannels.html, 2004, p. 1-3.
"Resources," Cooligy, Inc., http://cooligy.com/resources.html, 2004, p. 1.
"Innovation at the Cooligy Point," Cooligy, Inc., http://cooligy.com/technology.html, 2004, p. 1.
"Cooligy Unveils New Technology for Cooling Microprocessor Hot Spots; New 'Active Micro-Channel Cooling' Provides First Effective Solution for Next Breed of Powerful Semiconductors," Cooligy, Inc., Oct. 6, 2003, p. 1-2.

* cited by examiner

*Primary Examiner*—Gregory D Thompson

(57) ABSTRACT

An integrated circuit (IC) module has an IC die, a heat sink, a cooling fluid path and a fluid pump. The IC die, the heat sink and the fluid pump are mounted together. The fluid pump forces cooling fluid through the cooling fluid path to receive heat from the IC die and to transfer heat to the heat sink.

20 Claims, 3 Drawing Sheets

FLUID COOLED INTEGRATED CIRCUIT MODULE

BACKGROUND

Electronic printed circuit boards (PCBs), such as those used in computers or other electronic systems, commonly have a board with electronic components mounted thereon. The electronic components can generate a considerable amount of heat due to electrical power consumption. The heat must be dissipated from the components and the board to ensure proper functioning of the components and to prevent damage to any part of the PCB and the overall electronic system.

A variety of techniques have been developed to dissipate the heat. For instance, one low-cost technique simply allows the source of the heat to transfer the heat by convection to ambient air. However, this technique has a relatively low effectiveness. To enhance the effectiveness of dissipation by convection, a fan is added to force the air to flow over the component. A heat sink or heat spreader may be attached to the component to further enhance heat dissipation by conducting the heat away from the heat source to a surface area (larger than that of the component) from which the heat may be dissipated to the air. For even greater heat dissipation enhancement, increasingly sophisticated techniques have been developed, including "liquid loop" concepts involving the use of cooling fluids in heat pipes, active refrigeration systems and cooling plates. Each such enhancement, however, is offset by an added cost. It has been necessary to accept the added cost for enhanced heat dissipation techniques, though, because a significant trend in the electronics industry has been to continually increase the processing power and power consumption of electronic components, leading to increasingly greater needs for heat dissipation. The liquid loop concepts, for instance, are generally reserved for situations having relatively high heat dissipation requirements, because additional devices are required to be installed in the overall system.

The liquid loop concepts involve the use of a pump (or compressor), a cooling plate and a heat sink connected together by pipes, tubes or lines through which the cooling fluid flows. The cooling plate is placed on a surface of the heat source (the electronic component) to allow the heat to transfer to the cooling plate and then to the cooling fluid. The cooling fluid then flows to the heat sink at a location remote from the electronic component, such as outside of a housing containing the overall system of which the electronic component is a part, where the heat can be dissipated to ambient air. The cooling fluid then flows to the pump at another location remote from the electronic component and from the heat sink, which forces the cooling fluid through the pipes. Alternatively, for a liquid loop concept employing a compressor for active refrigeration of the cooling fluid, the cooling fluid flows from the cooling plate (attached to the electronic component) to the compressor, where the cooling fluid is compressed before flowing to the heat sink, or to a heat exchanger.

Since the pump, the heat sink and the cooling plate must be connected together by the pipes, since the cooling plate must be attached to the electronic component, and since the heat sink and pump must be remotely mounted within the overall system, there is considerable manufacturing and assembly work that must be done involving the proper installation of each of these devices when assembling the overall system. Therefore, in addition to the cost of the devices, the liquid loop concepts include significant time and cost for the assembling.

DETAILED DESCRIPTION

Figure 1:
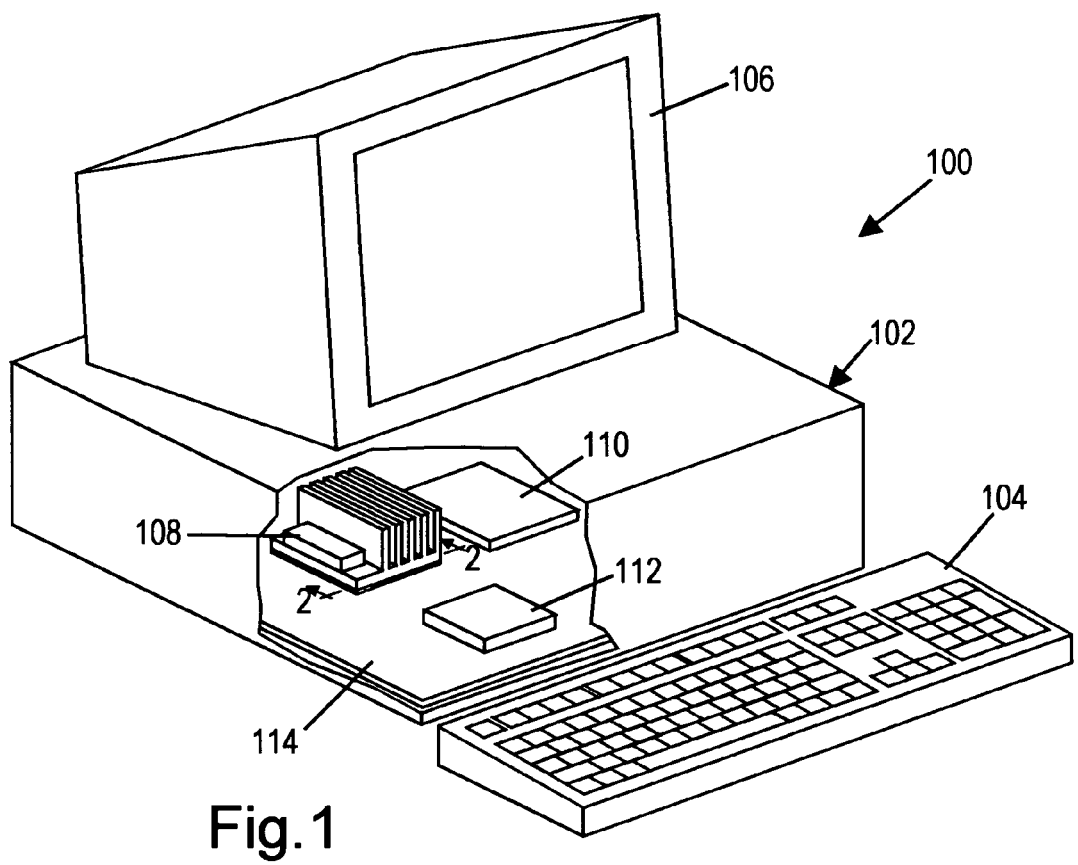
FIG. 1 is a top, front, left side perspective view of a computer system incorporating an embodiment of the present invention.

A computer system 100 incorporating an embodiment of the present invention is shown in FIG. 1 having elements such as a processor housing 102, a keyboard 104 and a display 106. Although the present invention is described with respect to its use in the computer system 100, it is understood that the invention is not so limited, but may be used in any appropriate electronic system that includes an element having an integrated circuit (IC), regardless of any other elements included in the electronic system.

Within the processor housing 102 is at least one IC module 108, incorporating an embodiment of the present invention, among a variety of other optional ICs 110 and 112 mounted on at least one printed circuit board (PCB) 114. The IC module 108 includes an IC die and a liquid loop subsystem integrated together, as described below, to assist in cooling the IC die during operation thereof. Since the liquid loop subsystem is integrated into the IC module 108, rather than comprised of multiple separate devices as described in the background, the IC module 108 can be incorporated into the computer system 100 without significant additional time and cost for assembling the computer system 100. In other words, there are no separate pipes, pumps, heat sinks, etc. to install in the computer system 100 and connect together during the assembly of the computer system 100. Incorporation of the IC module 108 in the computer system 100, therefore, enables the computer system 100 to have the heat dissipation advantages of a liquid loop cooling subsystem without additional assembly time or cost. Furthermore, as a single integrated module, the IC module 108 enables the ability to quickly and easily replace the IC module 108 in the field.

Figure 2:
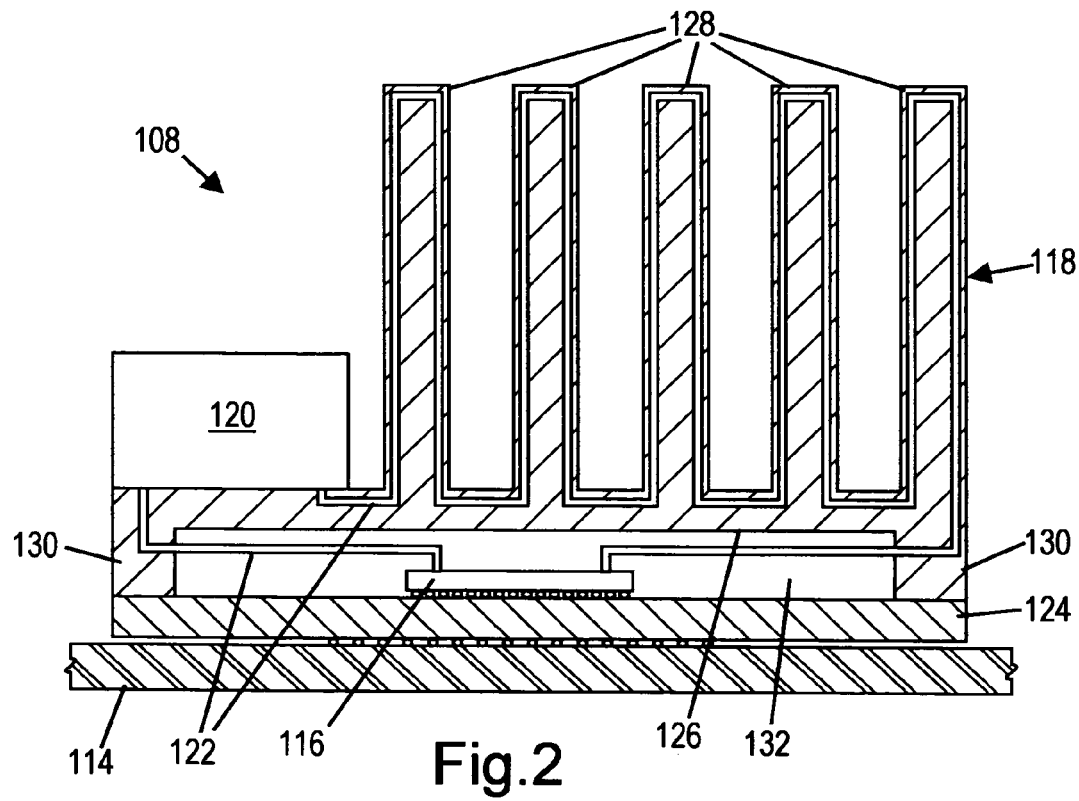
FIG. 2 is a cross sectional view of an integrated circuit module that may be incorporated in the computer system shown in FIG. 1 according to an embodiment of the present invention.

According to a particular embodiment, as shown in FIG. 2, the IC module 108 includes an IC die 116, a heat sink 118, a pump 120 and a cooling fluid path 122 through which a cooling fluid flows through each of these elements 116, 118 and 120. The cooling fluid may be a single-phase liquid (i.e. that does not undergo phase change in the liquid loop cycle) or two-phase liquid (i.e. that undergoes phase change during the heating and cooling thereof in the liquid loop cycle), depending on the situation. The IC die 116 may include any appropriate IC, such as a processor, ASIC (application specific integrated circuit), etc., and is mounted on a substrate 124. The heat sink 118 includes a base 126, heat dissipation fins 128 and a bottom peripheral skirt 130 that surrounds the IC die 116 and is mounted on the substrate 124. In this manner, the heat sink 118 and substrate 124 define a cavity 132 within which the IC die 116 is enclosed and protected from the ambient environment.

The substrate 124 is mounted on the PCB 114 either by solder, by a socket or by other appropriate connection means. The use of a releasable connections means, such as the socket, enables quick and easy removal and replacement of the IC module 108 in the computer system 100. A socket used with the liquid loop concept described in the background would not enable such quick and easy removal and replacement of an IC, because the pipe, or tube, connections for the cooling fluid have to be disconnected and reconnected without losing or spilling any of the cooling fluid.

The pump 120 may be any appropriate fluid circulation device, such as a direct or magnetically coupled mechanical pump, an electroosmotic pump, an electrokinetic pump, a MEM (micro electronic machine) pump, a peristaltic pump, a piston pump, a centrifugal pump, etc. Alternatively, the pump 120 may be a compressor for a refrigeration cycle to actively refrigerate the cooling fluid and, thus, the IC die 116.

The cooling fluid path 122 is from the pump 120, through a portion of the heat sink 118, to the IC die 116, through another portion of the heat sink 118 and back to the pump 120. (In the case of the pump 120 being a refrigeration compressor, the cooling fluid path 122 is through the same elements, but in the opposite direction.) Between the heat sink 118 and the IC die 116 the cooling fluid path 122 may be through pipes or tubes. Within the IC die 116 the cooling fluid path 122 may be through channels (or "micro-channels" to increase surface area) formed in the semiconductor silicon of the IC die 116 for on-die cooling. Within the heat sink 118 the cooling fluid path 122 may be through holes, cavities, micro-channels, porous media, pin structures or other features that enhance heat transfer in the material of the heat sink 118. According to the embodiment shown, a portion of the cooling fluid path 122 is within the heat dissipation fins 128 of the heat sink 118. In this manner, heat rejection is maximized by relatively efficiently transferring the heat from the IC die 116 to the cooling fluid and to the heat dissipation fins 128 for quick and efficient dissipation, while minimizing heat gradients within the IC module 108. Additionally, interior surfaces of the cooling fluid path 122 may have fins, grooves, micro-channels or other means to enlarge the interior surface area, thereby enhancing heat transfer to and from the cooling fluid. Furthermore, the cooling fluid path 122 may split or divide into a network or web of paths in order to spread the cooling fluid throughout the heat sink 118 and/or the IC die 116 to enhance surface contact and heat transfer.

Figure 3:
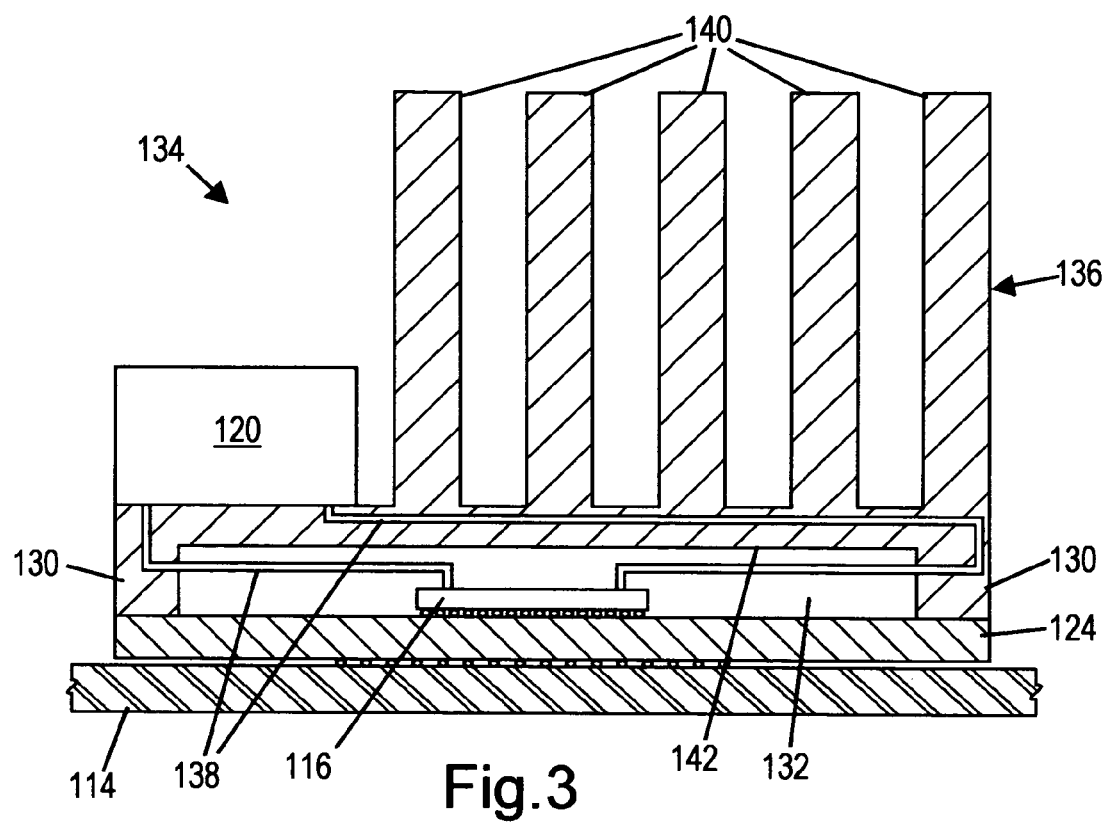
FIG. 3 is a cross sectional view of another integrated circuit module that may be incorporated in the computer system shown in FIG. 1 according to an alternative embodiment of the present invention.

According to an alternative particular embodiment, as shown in FIG. 3, an alternative IC module 134 is similar to the IC module 108 with respect to those elements having the same reference numbers. The primary differences generally involve the structures of the heat sink 136 and the cooling fluid path 138. The heat sink 136 includes heat dissipation fins 140, a base 142 and the bottom peripheral skirt 130 (see also FIG. 2). In this embodiment, however, the cooling fluid path 138 does not include a portion in the heat dissipation fins 140. Rather, the base 142 is the only part of the heat sink 136 includes a portion of the cooling fluid path 138. Therefore, since the cooling fluid does not flow into the heat dissipation fins 140 for direct transfer of the heat from the cooling fluid to the heat dissipation fins 140, the heat sink 136 and the IC module 134 do not have the heat dissipation efficiency or effectiveness of the heat sink 118 and the IC module 108 shown in FIG. 2. However, the heat sink 136 and the IC module 134 are less expensive than the heat sink 118 and the IC module 108, because the heat sink 136 does not have to be formed with holes, cavities or other such structures in the heat dissipation fins 140.

Figure 4:
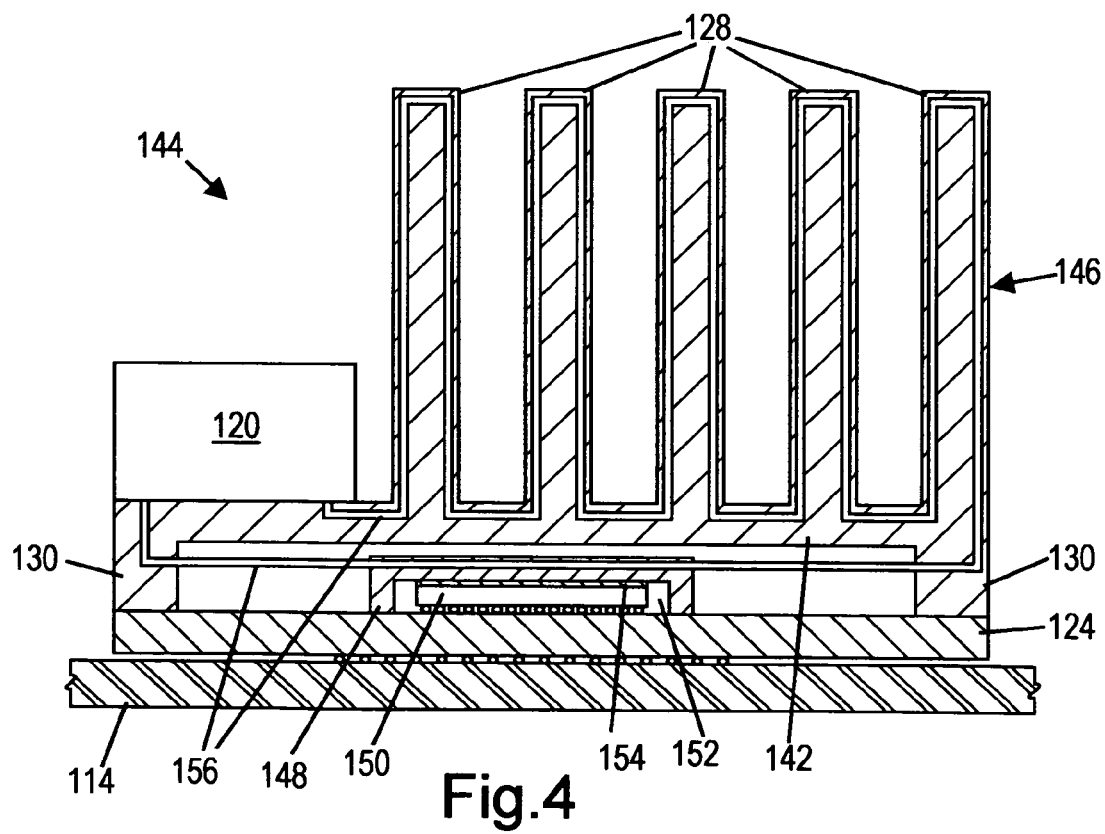
FIG. 4 is a cross sectional view of another integrated circuit module that may be incorporated in the computer system shown in FIG. 1 according to another alternative embodiment of the present invention.

According to another alternative particular embodiment, as shown in FIG. 4, another alternative IC module 144 is similar to the IC modules 108 and 134 with respect to those elements having the same reference numbers. Additionally, the heat sink 146 may be similar to either heat sink 118 or 136, as described above. The IC module 144, however, includes an IC lid 148 that surrounds the IC die 150 and is mounted on the substrate 124. In this manner, the IC lid 148 and substrate 124 define a cavity 152 within which the IC die 150 is enclosed and protected from the ambient environment. Additionally, a thermal interface material 154 is placed between the IC die 150 and the IC lid 148, so the IC die 150 and the IC lid 148 are in a thermally conductive relationship. The cooling fluid path 156 does not include a portion through the IC die 150, so the IC die 150 does not include micro-channels, as does the IC die 116 (FIGS. 2 and 3). Instead, a portion of the cooling fluid path 156 is through the IC lid 148, which is formed with holes, cavities, micro-channels, porous media, pin structures or other features that enhance heat transfer through which the cooling fluid flows. Therefore, the heat generated by the IC die 150 is conducted through the thermal interface material 154, to the IC lid 148 (which serves as a "cold plate"), to the cooling fluid and then to the heat sink 146 (with or without passing through the heat dissipation fins 128) for dissipation. Additionally, since the IC lid 148 and substrate 124 surround the IC die 150, the bottom peripheral skirt 130 of the heat sink 146 is optional or does not have to completely surround the IC die 150, so the heat sink 146 may be supported on either the substrate 124 (as shown) or on the IC lid 148 by any suitable means, such as an epoxy or thermal interface material.

Figure 5:
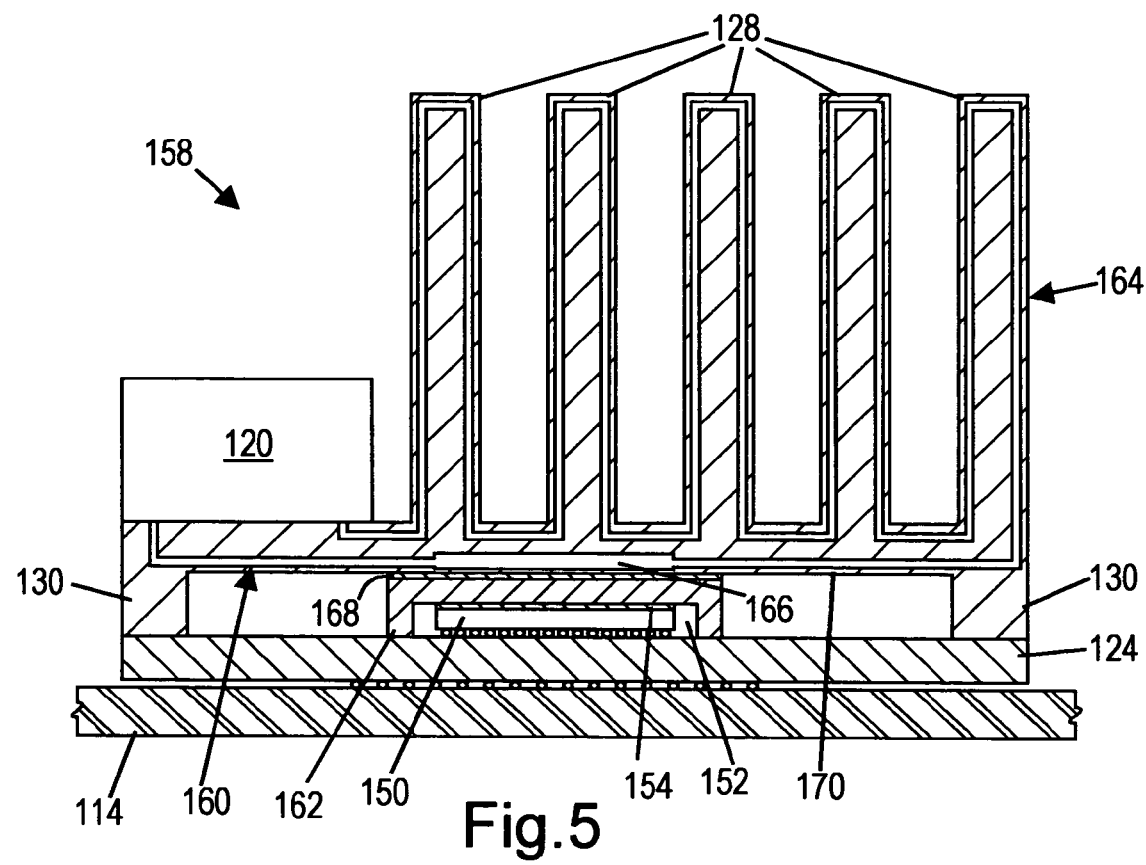
FIG. 5 is a cross sectional view of another integrated circuit module that may be incorporated in the computer system shown in FIG. 1 according to another alternative embodiment of the present invention.

According to yet another alternative particular embodiment, as shown in FIG. 5, another alternative IC module 158 is similar to the IC modules 108, 134 and/or 144 with respect to those elements having the same reference numbers. The cooling fluid path 160, however, includes no portion within either the IC die 150 or the IC lid 162. Instead, the cooling fluid path 160 is from the pump 120, through the heat sink 164 (with or without passing through the heat dissipation fins 128) and back to the pump 120. Additionally, the cooling fluid path 160 may include a "cold plate" region 166 near the IC lid 162 within the heat sink 164. Furthermore, a thermal interface material 168 is placed between the IC lid 162 and the heat sink 164, so the IC lid 162 and the heat sink 164 are in a thermally conductive relationship. The heat generated by the IC die 150, therefore, is transferred through the thermal interface material 154, through the IC lid 162, through the thermal interface material 168, into the base 170, into the cooling fluid within the cold plate region 166. The cooling fluid then flows through the heat dissipation fins 128 (or across the top of the base 170 as in FIG. 3) to dissipate the heat. An additional benefit of this embodiment is that, if the pump 120 fails, the heat sink 164 still dissipates the heat generated by the IC die 150, albeit at a lower efficiency, since the heat can still be transferred from the base 170 to the heat dissipation fins 128 without the benefit of the cooling fluid. Additionally, since the IC lid 162 and substrate 124 surround the IC die 150, the bottom peripheral skirt 130 of the heat sink 164 is optional or does not have to completely surround the IC die 150, so the heat sink 164 may be supported on either the substrate 124 (as shown) or on the IC lid 162 by any suitable means, such as an epoxy or thermal interface material. Furthermore, the combined heat sink 164 and pump 120 are an integral unit and the combined IC die 150, IC lid 162 and substrate 124 are another integral unit (i.e. an IC package). Therefore, these integral units may be independently assembled in the event that the manufacturer of the IC package (150, 162 and 124) does not assemble the IC module 158 as a single unit. Instead, this embodiment allows the manufacturer of the computer system 100 (FIG. 1) the flexibility to can make the decision of whether to use the combined heat sink 164 and pump 120 with the IC package (150, 162 and 124). As an alternative, however, the heat sink 164 may replace the IC lid 162, thereby enhancing heat transfer by reducing the number of thermal junctions between the IC die 150 and the heat sink 164.

Figure 6:
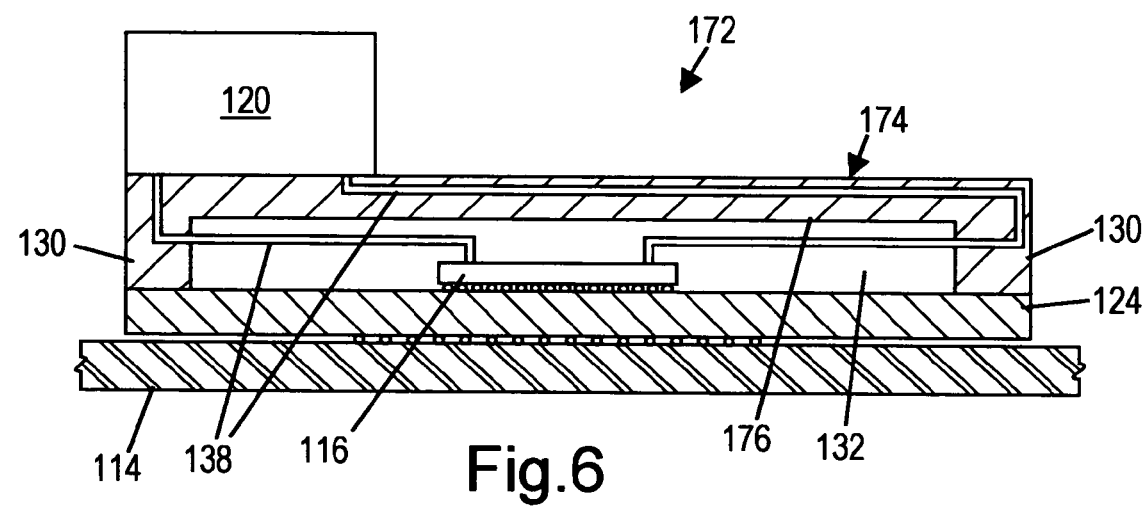
FIG. 6 is a cross sectional view of another integrated circuit module that may be incorporated in the computer system shown in FIG. 1 according to another alternative embodiment of the present invention.

According to yet another alternative particular embodiment, as shown in FIG. 6, another alternative IC module 172 is similar to the IC modules 108, 134, 144 and/or 158 with respect to those elements having the same reference numbers. The heat sink 174, however, does not have heat dissipation fins. This embodiment, therefore, enables the placement of any type of heat dissipation device on the top surface of the base 176 of the heat sink 174. For example, a heat sink with heat dissipation fins may be soldered, epoxied or bolted to the base 176 to function similarly to the heat dissipation fins 140 shown in FIG. 3. Such a construction would, though, would likely have a lower heat dissipation efficiency due to the junction between the base 176 and the attached heat sink. Alternatively, a cold plate may be attached to the base 176 and connected in a liquid loop to a remotely located pump and heat sink. Such a construction may increase the overall heat dissipation efficiency within the computer system 100 (FIG. 1), while sacrificing some of the assembly time and cost advantages of other embodiments. An advantage of this embodiment over the other described embodiments, however, is increased flexibility in using the IC module 172 in a wide variety of situations, since the IC module 172 may be incorporated with any other heat dissipation device that fits the situation.

Other embodiments of the present invention may combine features of the above-described embodiments. For example, a heat sink without heat dissipation fins, as shown in FIG. 6, may be incorporated in any of the other embodiments. Alternatively, any of the embodiments having a heat sink with heat dissipation fins may have the cooling fluid path through the heat dissipation fins or not. Additionally, interior surfaces of the cooling fluid path in any of the embodiments may have fins, grooves, micro-channels or other means to enlarge the interior surface area, thereby enhancing heat transfer to and from the cooling fluid. Furthermore, the cooling fluid path may split or divide into a network or web of paths within any or all of the elements through which the cooling fluid flows in order to spread the cooling fluid throughout these elements to enhance surface contact and heat transfer. Moreover, in each embodiment in which there is a gap between the heat sink and the IC die, the gap may be filled with a thermal interface material or thermally conductive pad to enable another heat transfer path independent of the cooling fluid path.

I claim:

1. A computer system comprising:
   a housing;
   a printed circuit board mounted within the housing; and
   an integrated circuit module mounted on the printed circuit board and comprising:
   an integrated circuit die that produces heat upon operation thereof;
   a heat sink mounted together with the integrated circuit die and that dissipates heat to ambient air within the housing, the heat sink comprising heat dissipation fins between which air flows;
   a cooling fluid path through which cooling fluid flows to receive the heat from the integrated circuit die and to transfer the heat to the heat sink, a portion of the cooling fluid path being within the heat dissipation fins; and
   a fluid pump mounted together with the heat sink and integrated circuit die and in line with the cooling fluid path to force the cooling fluid through the cooling fluid path, including forcing the cooling fluid through the portion of the cooling fluid path within the heat dissipation fins.

2. A computer system as defined in claim 1 wherein:
   the fluid pump comprises a fluid compressor for refrigeration of the cooling fluid.

3. A computer system as defined in claim 1 wherein:
   the integrated circuit die comprises fluid channels through which fluid can flow; and
   a portion of the cooling fluid path is within the fluid channels.

4. A computer system as defined in claim 1 wherein:
   the fluid pump is mounted on a portion of the heat sink.

5. A computer system as defined in claim 1 wherein:
   the heat sink is positioned above and separated from the integrated circuit die.

6. A computer system as defined in claim 1 further comprising:
   a substrate on which the integrated circuit die and heat sink are mounted with a portion of the heat sink above and separated from the integrated circuit die.

7. A computer system as defined in claim 6 wherein:
   the substrate and the heat sink form a cavity within which the integrated circuit die is located.

8. An integrated circuit module comprising:
   an integrated circuit die that produces heat upon operation thereof;
   a heat sink mounted together with the integrated circuit die and that dissipates heat, the heat sink comprising heat dissipation fins between which air flows;
   a cooling fluid path through which cooling fluid flows to receive the heat from the integrated circuit die and to transfer the heat to the heat sink, a portion of the cooling fluid path being within the heat dissipation fins; and
   a fluid pump mounted together with the heat sink and integrated circuit die and in line with the cooling fluid path to force the cooling fluid through the cooling fluid path, including forcing the cooling fluid through the portion of the cooling fluid path within the heat dissipation fins.

9. An integrated circuit module as defined in claim 8 wherein:
   the fluid pump comprises a fluid compressor for refrigeration of the cooling fluid.

10. An integrated circuit module as defined in claim 8 wherein:
the integrated circuit die comprises fluid channels through which fluid can flow; and
a portion of the cooling fluid path is within the fluid channels.

11. An integrated circuit module as defined in claim 8 wherein:
the fluid pump is mounted on a portion of the heat sink.

12. An integrated circuit module as defined in claim 8 wherein:
the heat sink is positioned above and separated from the integrated circuit die.

13. An integrated circuit module as defined in claim 8 further comprising:
a substrate on which the integrated circuit die and heat sink are mounted with a portion of the heat sink above and separated from the integrated circuit die.

14. An integrated circuit module as defined in claim 13 wherein:
the substrate and the heat sink form a cavity within which the integrated circuit die is located.

15. An integrated circuit module comprising:
a means for generating heat upon operation of the integrated circuit module;
a means for dissipating heat to ambient air and including a plurality of fin means for dissipating heat to the ambient air, each fin means being separated from other fin means by air; and
a means for forcing a flow of cooling fluid between a location at which the heat can be transferred from the heat generating means to the cooling fluid and a location within the fin means of the heat dissipating means at which the heat can be transferred from the cooling fluid to the fin means of the heat dissipating means;
and wherein the heat generating means, the heat dissipating means and the cooling fluid flow forcing means are mounted together in the integrated circuit module.

16. An integrated circuit module as defined in claim 15 wherein:
the cooling fluid flow forcing means further comprises a means for compressing the cooling fluid to cause refrigeration of the cooling fluid.

17. An integrated circuit module as defined in claim 15 further comprising:
a means, formed on the heat generating means, for channeling the cooling fluid through the heat generating means.

18. A heat sink for use with an integrated circuit package comprising:
a base;
heat dissipation fins extending from the base and being separated from each other by air;
a cooling fluid path within the base and the heat dissipation fins through which cooling fluid flows to receive the heat from the integrated circuit package at the base and to dissipate the heat at the heat dissipation fins; and
a fluid pump mounted on the base and in line with the cooling fluid path to force the cooling fluid through the cooling fluid path, including within the heat dissipation fins.

19. A method of cooling an integrated circuit die within an integrated circuit module, comprising:
generating heat by the integrated circuit die by operating the integrated circuit die;
flowing cooling fluid through a location within the integrated circuit module at which the cooling fluid can receive the heat from the integrated circuit die to cool the integrated circuit die;
flowing the cooling fluid through a heat sink mounted together with the integrated circuit die in the integrated circuit module, the heat sink including heat dissipation fins separated by air and the flowing of the cooling fluid through the heat sink includes forcing the flow of the cooling fluid through the heat dissipation fins, wherein the heat is transferred to the heat sink to cool the cooling fluid; and
flowing the cooling fluid through a fluid pump mounted together with the heat sink and integrated circuit die in the integrated circuit module to pump the cooling fluid by the fluid pump back to the location at which the cooling fluid can receive the heat from the integrated circuit die.

20. A method as defined in claim 19 wherein:
the flowing of the cooling fluid through the fluid pump further comprises compressing the cooling fluid to cause refrigeration of the cooling fluid.

* * * * *